United States Patent [19]
Taniguchi et al.

[11] Patent Number: 5,116,646
[45] Date of Patent: May 26, 1992

[54] METHOD OF METALLIZING OXIDE CERAMIC WITH EXCELLENT HERMETIC SEALING AND BRAZING PROPERTIES

[75] Inventors: Hirokazu Taniguchi; Shogo Konya; Akira Okamoto, all of Sakai, Japan

[73] Assignee: Nippon Steel Corporation, Tokyo, Japan

[21] Appl. No.: 728,839

[22] Filed: Jul. 9, 1991

Related U.S. Application Data

[63] Continuation of Ser. No. 379,633, Jul. 13, 1989, abandoned.

[30] Foreign Application Priority Data

Mar. 3, 1989 [JP] Japan .................................. 1-51271

[51] Int. Cl.$^5$ .............................................. C23C 26/00
[52] U.S. Cl. .............................. 427/383.5; 427/383.1; 427/383.7; 427/126.2; 427/123; 427/404; 427/419.1
[58] Field of Search ............... 427/383.5, 383.1, 383.7, 427/126.2, 123, 404, 419.1

[56] References Cited

U.S. PATENT DOCUMENTS

| | | | |
|---|---|---|---|
| 2,903,788 | 9/1959 | Pryslak | 427/383.5 |
| 3,023,492 | 3/1962 | Bristow | 427/126.2 |
| 4,025,669 | 5/1977 | Greenstein | 427/123 |
| 4,289,829 | 9/1981 | Rossetti | 427/383.5 |
| 4,317,750 | 3/1982 | Provance | 427/126.2 |
| 4,510,000 | 4/1985 | Kumar | 427/125 |
| 4,567,110 | 1/1986 | Jarvinen | 428/433 |
| 4,678,683 | 7/1987 | Pasco | 427/383.5 |
| 4,684,446 | 8/1987 | Charles | 427/98 |
| 4,732,780 | 3/1988 | Mitoff | 427/125 |
| 4,766,010 | 8/1988 | Takeuichi | 427/101 |
| 4,822,645 | 4/1989 | Oda | 427/126.2 |
| 4,833,039 | 5/1989 | Mitoff | 427/125 |

FOREIGN PATENT DOCUMENTS 83834 7/1983 European Pat. Off. .

OTHER PUBLICATIONS

Derwent Publications Ltd, London, GB, Database WPIL, No. 84-021510.
M. E. Twentyman, "High-Temperature Metallizing", Journal of Materials Science, 10(1975), pp. 765-776.

*Primary Examiner*—Shrive Beck
*Assistant Examiner*—Vi Duong Dang
*Attorney, Agent, or Firm*—Wenderoth, Lind & Ponack

[57] ABSTRACT

A method of metallizing an oxide ceramic with excellent hermetic sealing and brazing properties, comprising the steps of applying to a sintered oxide ceramic a first paste prepared by mixing with an organic vehicle a powder mixture composed of 70 to 95 wt % of a wolfram powder having an average particle diameter of 10 μm or less and 30 to 5 wt % of a glass powder having an average particle diameter of 10 μm or less and a melting point of from 1100° to 1300° C.; drying the first paste-applied ceramic to form a primary coating on the ceramic; applying to the primary coating a second paste prepared by mixing with an organic vehicle one or more powders selected from the group consisting of nickel, nickel oxide, and nickel salt powders; drying the second paste-applied ceramic to form a final coating on the primary coating; and firing the ceramic having the primary and the final coatings thereon at a temperature of from 1200° to 1400° C. in an atmosphere having a $H_2/H_2O$ ratio higher than 1 and lower than 100000 in terms of partial pressure ratio.

6 Claims, 3 Drawing Sheets

METHOD OF METALLIZING OXIDE CERAMIC WITH EXCELLENT HERMETIC SEALING AND BRAZING PROPERTIES

This application is a continuation of now abandoned application, Ser. No. 07/379,633 filed Jul. 13, 1989.

BACKGROUND OF THE INVENTION

1. Field of the Invention

The present invention relates to a method of metallizing an oxide ceramic with excellent hermetic sealing properties and brazing properties.

2. Description of the Related Art

The bonding of a metal to an oxide ceramic is widely utilized, for example, in the production of microwave output windows of magnetrons, vacuum switches, and the like, and for this purpose, the joint interface between the metal member and the ceramic member must have a hermetic sealing property. Accordingly, to ensure a good bonding, the ceramic member is generally metallized and then brazed to the metal member.

Most metallizing operations are carried out by the moly-manganese process, in which powders of refractory metals (metals having high melting points) such as molybdenum or wolfram are mixed with a manganese powder to form a powder mixture, which is then mixed with an organic vehicle to form a paste. The thus prepared paste is applied to an oxide ceramic, and the paste-applied ceramic is fired or calcined to form a molybdenum layer or a wolfram layer thereon. The ceramic member is then nickel-plated to form a nickel coating layer on the refractory metal layer and then brazed to a metal member. This nickel-plating is indispensable in the conventional moly-manganese process, since the wettability and the heat resistance of a brazing filler material become poor when the nickel coating is not formed, but the nickel-plating of a metallized surface formed by the moly-maganese process is very difficult and various treatments are necessary; i.e., a metallized surface produced by the moly-manganese process is partially coated with a glass phase, which must be removed, and an activation treatment with palladium chloride, an acid treatment and other treatments are necessary, to modify the surface property. As described above, the moly-manganese process is cumbersome in that it requires numerous processing steps which considerably increases the production cost, although it does provide an excellent hermetic sealing property.

The present inventors investigated a way in which the latter of the two steps of metallizing and nickel-plating could be omitted, since the metallizing step is essential but the nickel-plating step is merely assistive and not essential, and requires much equipment for the pretreatment, plating, and water treatment processes involved, for example. Note hereinafter the metallized layer composed of molybdenum or wolfram is referred to as the lower metallized layer and the layer containing Ni as a main component and deposited on the lower metallized layer is referred to as the upper Ni layer. A reduction of the steps needed for forming the upper Ni layer would lead to a considerable reduction of the total cost of the metallizing process, and from this point of view, the present inventors investigated ways in which the steps of forming the upper Ni layer could be completely omitted.

To omit the various steps of forming the upper Ni layer, it can be easily considered to utilize a two-step firing process in which a metallized layer is first formed on a ceramic by the moly-manganese process, a paste prepared by mixing Ni powder with an organic vehicle is applied to the first layer, and then a second firing is carried out. Although this process eliminates the need for plating equipment, nevertheless it requires two firing steps, i.e., the firing step must be repeated, and thus there is no reduction of cost. The present inventors proposed the simultaneous forming of the lower metallized layer and the upper Ni layer by a co-firing process in which a paste prepared by mixing a powder mixture of molybdenum and manganese with an organic vehicle is applied to a ceramic by screen printing, a nickel paste is applied by screen printing, and then firing is carried out. This process was not successful in practice because it was found that the co-firing caused a fusing of the Ni layer and reduced the strength of the lower refractory metal layer, probably due to the large difference of the melting point and the self diffusion coefficient of the two metals. Namely, it was proved that a sound metallized layer cannot be formed by a double coating of a refractory metal paste and a Ni paste. Although many double-coating and co-firing processes are known in the metallizing field, all of these processes relate only to an improvement of the formation of a lower metallized layer, and do not relate to a simultaneous formation of the lower metallized layer and the upper Ni layer by a single firing step, which is the object of the present invention. For example, Japanese Examined Patent Publication (Kokoku) No. 36-6542 discloses a process in which a first layer is formed of a mixture of a refractory metal and a ceramic, and a second layer is formed of a refractory metal. This process relates to an improved formation of the lower metallized layer, does not omit the steps for forming the upper Ni layer, and has a gist quite different from that of the present invention. The first and second layers are composed of the same metal, Mo, and the co-firing of the same metal is essentially the same as the firing of a single layer: Problems arise when two different metals such as W and Ni are to be fired simultaneously. Japanese Unexamined Patent Publication (Kokai) No. 58-213688 discloses a process in which an oxide powder of a high melting point metal is used as a first layer and a refractory metal is used as a second layer, to reduce the electric resistance of the metallized portion. Similar to Japanese Examined Patent Publication (Kokoku) No. 36-6542, this process relates to the formation of the lower metallized layer and has a gist different from that of the present invention, which covers the plating step. Japanese Unexamined Patent Publication (Kokai) No. 58-213688 does not provide a Ni layer and various steps for forming the upper Ni layer are necessary before brazing.

As mentioned above, to provide a good brazing property by metallizing an oxide ceramic, the surface of the ceramic must be coated with nickel and a high hermetic sealing property of the brazing is required when a bonded assembly is used as a material for electronic tubes. Conventional processes, however, have a drawback in that two steps of the formation of the lower metallized layer and the formation of the upper Ni layer are required, the latter including various treatment steps, which greatly increase the production costs.

Therefore, a method of metallizing which lowers the production cost while ensuring an excellent hermetic sealing and brazing properties is urgently required.

SUMMARY OF THE INVENTION

The object of the present invention is to provide a method of metallizing an oxide ceramic which enables a simultaneous forming of the lower metallized layer and the upper Ni layer by co-firing an optimized double coating.

To achieve the above object, according to the present invention there is provided a method of metallizing an oxide ceramic to provide superior hermetic sealing and brazing properties, comprising the steps of:

applying to a sintered oxide ceramic a first paste prepared by mixing with an organic vehicle a powder mixture composed of 70 to 95 wt% of a wolfram powder having an average particle diameter of 10 μm or less and 30 to 5 wt% of a glass powder having an average particle diameter of 10 μm or less and a melting point of from 1100° to 1300° C., drying the first paste-applied ceramic to form a primary coating on the ceramic, applying to the primary coating a second paste prepared by mixing with an organic vehicle one or more powders selected from the group consisting of nickel, nickel oxide, and nickel salt powders, drying the second paste-applied ceramic to form a final coating on the primary coating, and firing the ceramic having the primary and the final coatings thereon at a temperature of from 1200° to 1400° C. in an atmosphere having a $H_2/H_2O$ ratio higher than 1 and lower than 100000 in terms of partial pressure ratio.

The present inventors carried out an intensive study into a method of metallizing alumina ceramic which will provide a remarkable reduction in production cost compared with the conventional moly-manganese process, while ensuring hermetic sealing and brazing properties comparable with or superior to those obtained by the conventional process.

The steps used in the conventional moly-manganese process will be described below. A paste of a refractory metal such as molybdenum or wolfram and a manganese is first applied to an alumina ceramic, which is then placed in a furnace of a controlled atmosphere in which manganese is oxidized but molybdenum is not oxidized, for example, in an atmosphere having a $N_2/H_2$ ratio of 9/1 in terms of volume ratio, a dew point of 40° C., and held at 1450° C. Molybdenum is sintered at such a temperature to form a network which composes the framework of the metallized layer. Little plating can be effected on the as-formed molybdenum layer, probably because the metallized surface is coated with a glassy phase and/or a thin film of oxidized refractory metal is formed on the surface, and to eliminate these obstacles, a degreasing, removal of the glassy phase, an acid treatment, an activation treatment, and other treatments are carried out. The moly-manganese process has only one drawback in that, after the molybdenum layer is formed, numerous pretreatments and plating treatment are required to form a surface Ni layer.

The present inventors attempted a single step process in which a primary coating of molybdenum is formed, a final coating of nickel is then formed on the molybdenum coating, and these two coatings are simultaneously fired. But this process could not provide a sound metallized layer because nickel diffused into the molybdenum, with the result that a fusion of the eutectic phase or over-sintering occurred. This is caused by the dissolution of nickel into molybdenum during firing and the resulting increase of the self-diffusion coefficient of the molybdenum, and showed that the selection of the first or lower layer metal is very important when forming an upper nickel layer by a single firing step. The present inventors found that a sound metallized layer can be obtained when a final coating metal has an activation energy of self-diffusion of from 0.2 to 0.6 times that of a primary coating metal, i.e., molybdenum or wolfram. For example, nickel is suitable as a final coating metal when the primary coating metal is wolfram, and silver is suitable as a final coating metal when the primary coating metal is molybdenum, and so on. Therefore, wolfram is suitable as a primary coating metal in the present invention in which the uppermost surface of the metallized layer is nickel, and thus, the present inventors studied the possibility of metallization by combining nickel and wolfram. As a result, the present inventors found that wolfram is the optimum primary or lower layer coating metal when the final coating is formed of nickel, and that the aforementioned problem arising in an alumina ceramic can be solved by an application of a mixture of wolfram and glass.

The present invention enables the numerous steps indispensable after forming a molybdenum layer in the conventional moly-manganese process to be omitted without impairing the metallized layer characteristics.

DESCRIPTION OF THE PREFERRED EMBODIMENT

The metallization according to the present invention is typically carried out in the following manner.

Figure 2A:
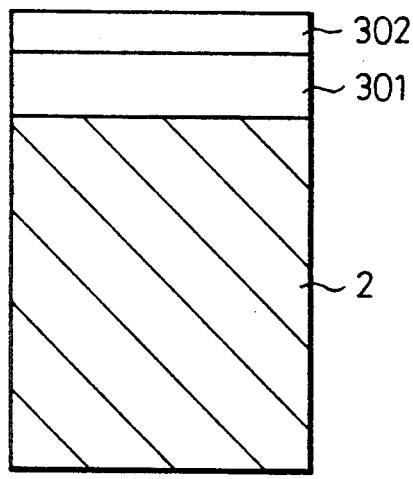
FIG. 2 illustrates two pastes applied to the surface of a sintered alumina ceramic, FIG. 2(a) being a sectional view and FIG. 2(b) schematically showing a distribution of powders of wolfram (W), glass (G), and nickel source (N)

Referring to FIG. 2(a), a first paste, which has been prepared by mixing with an organic vehicle a mixture of a wolfram powder and a glass powder, is applied to a sintered alumina ceramic 2 (which is an oxide ceramic) and is dried to form a first, lower layer (or a primary coating) 301. The wolfram powder and the glass powder have an average particle diameter adjusted to not more than 10 μm. Hereinafter the term "particle diameter" means "average particle diameter" unless otherwise particularly specified.

Figure 2B:
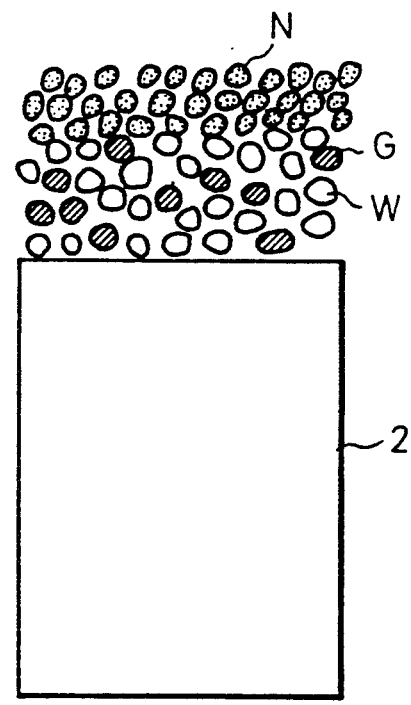

Glass has different characteristics depending on the composition thereof, and a glass must have a melting point of from 1100° to 1300° C. to form a sound metallized layer. For example, an $Al_2O_3$-$MnO$-$SiO_2$ glass can be used. An organic vehicle can be prepared by mixing an organic binder such as ethylcellulose with an organic solvent such as terpineol, to adjust the viscosity. A second paste, which has been prepared by mixing with an above-described organic vehicle one or more powders selected from the group consisting of nickel, nickel oxide, and nickel salt powders, is applied onto the first or lower layer 301 and then dried to form a second or upper layer (or a final coating) 302. The nickel, nickel oxide, and nickel salt powders need not be specified as long as they have a particle diameter of not more than 10 μm. FIG. 2(b) schematically shows the distribution of the wolfram powder particles (W), the glass powder particles (G), and the particles (N) of nickel, nickel oxide, and/or nickel salt powders.

Figure 1:
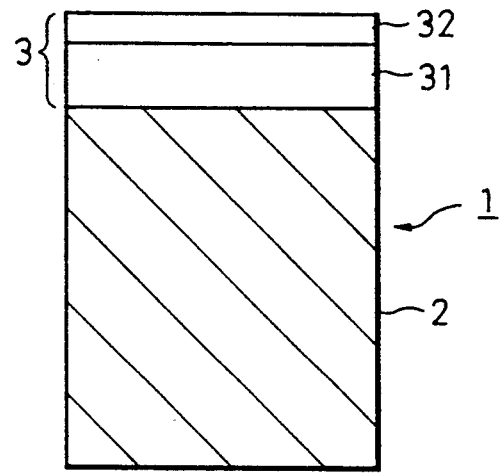
FIG. 1 is a sectional view of a metallized layer formed according to the present invention.
Figure 3:
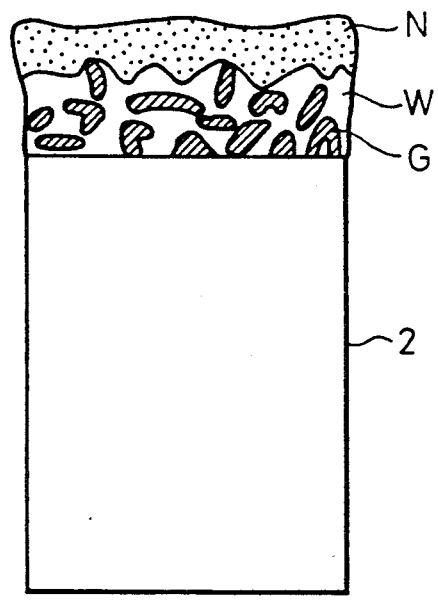
FIG. 3 is a sectional view schematically showing a metallized layer formed by firing a sintered alumina ceramic, according to the present invention, in which W, G, and N denote wolfram, glass, and nickel phases, respectively.

The sintered ceramic 2 having the lower and the upper layers 301 and 302 is fired at a temperature of from 1200° to 1400° C. in an atmosphere described later. During this firing, wolfram powder of the lower layer 301 is sintered to an extent as shown in FIG. 3, while glass powder contained in the first paste fuses and part thereof flows on the sintered ceramic 2 to react with alumina; the remainder of the glass fills the interstices in the wolfram network to form a mixed layer of wolfram and glass. Further, the nickel, nickel oxide, and/or nickel salt powder contained in the upper layer 302 is reduced to nickel metal under the firing atmosphere condition and is fully sintered to coat the wolfram layer and form a nickel layer. FIG. 1 shows a section of a metallized layer 3 formed in the above-described manner on the sintered ceramic 2. The metallized layer 3 is composed of a layer 31 of mixed wolfram and glass formed on the sintered ceramic 2 and a nickel layer 32 formed on the mixed layer 31. Wolfram can be dissolved in the nickel layer 32 in a concentration of up to the solubility limit thereof but does not affect the brazing properties. Thus, a metallized layer 3 is formed on and adhered to the sintered ceramic 2. After cooling, the alumina and glass form a continuous phase and the wolfram and glass are strongly bonded by an anchoring effect. Consequently, the alumina and the wolfram phases are bonded via the glassy phase and the wolfram and the nickel phases are bonded through an interdiffusion therebetween to form a metallized alumina ceramic 1.

The glass used in the present invention must have a melting point of from 1100° to 1300° C., and an $Al_2O_2$-$MnO$-$SiO_2$ glass is preferable from this point of view but it is not limited thereto. Any glass may be used if it has a melting point falling within the above-specified range.

When the melting point of glass is lower than 1100° C., the glass itself has a poor strength and an excessive flowability causing a reduction of the strength of the metallized layer. On the other hand, when the melting point of the glass is higher than 1300° C., it has a low fluidity such that the interstices between wolfram particles are not completely filled, causing a poor hermetic sealing property.

The wolfram particle diameter is limited to not more than 10 μm. When the diameter is outside this range, the difference between the wider and the narrower interparticle spacings of wolfram particles becomes so significant that glass moves to the narrower spacings and no glass exists in the wider spacings, because of capillarity, and thus a hermetic sealing property is not obtained. The glass powder also must have a particle diameter of not more than 10 μm, for the same reason as given for the wolfram particle diameter. When glass powder having a particle diameter of more than 10 μm is fused, it is absorbed in the narrower wolfram particle spacings to leave voids at sites where the glass was initially located.

The mixing ratio of the wolfram powder and the glass powder is limited to a ratio of 70 to 95 wt% wolfram to 30 to 5 wt% glass, preferably 80 to 90 wt% wolfram to 20 to 10 wt% glass. When the amount of wolfram powder is excessive, the absolute content of glass is too little to fill the wolfram network, with the result that the hermetic sealing property cannot be ensured. If the amount of the wolfram powder is less than the above-specified amount, the wolfram network cannot be formed and this results in an insufficient strength of the metallized layer.

The nickel sources, i.e., nickel, nickel oxide, and nickel salt powder, also must have a particle diameter of not more than 10 μm. If the nickel sources have a particle diameter outside this range, the sintering does not fully proceed and the mixed wolfram and glass layer 31 cannot be completely coated, with the result that the brazing property is impaired. The number of sites where the nickel particles are in contact with the wolfram particles is reduced, resulting in a poor strength. All of the nickel, nickel oxide, and nickel salt are reduced to nickel metal during firing in the specified atmosphere described later, and there is no effective difference between these nickel sources.

The firing temperature must be from 1200° to 1400° C., preferably from 1300° to 1350° C. When the firing temperature is lower than 1200° C., alumina and glass do not fully react and the glass has a poor fluidity, resulting in an insufficient strength and hermetic sealing property. When the firing temperature is higher than 1400° C., wolfram is over-sintered to reduce the voids to be filled with glass, which eliminates the anchoring effect between the wolfram and glass and lowers the strength of the metallized layer.

The firing atmosphere must have a hydrogen-water vapor ($H_2/H_2O$) ratio of more than 1 and less than 100000 in terms of partial pressure ratio. A ratio of 1 or less causes an oxidation of the wolfram and a ratio of 1000000 or more causes a reduction of the glass to precipitate the metal phase, and the alumina is significantly discolored. An atmosphere having a hydrogen-water vapor ratio within the specified range may contain an inert gas such as $N_2$, Ar, and He. A preferable atmosphere is a stream of a gas having a dew point of about 20° C. and a $H_2:N_2$ ratio of about 10:90 in terms of volume ratio.

The metallized layer formed according to the present invention has the following features.

The nickel layer is most characteristic of the present invention. Namely, the first feature is that a Ni source paste is applied by a screen printing or the like, which enables a thicker (10 μm or more) Ni layer to be obtained in comparison with that obtained by plating, and is advantageous with regard to heat resistance, etc. Ni is essentially heat-resistive and a thicker Ni layer improves the heat resistance of the metallized surface. In the conventional metallizing method in which the nickel layer is formed by plating, the nickel layer thickness is usually limited to about 2 to 4 μm, since an increased thickness of the nickel layer increases production costs. This is very disadvantageous from the viewpoint of heat resistance. For example, a 650° C. holding test in air for a few minutes may result in an oxidation of the metallized layer, which causes a loss of the vacuum sealing property and a lowering of the strength to a level of one third of the initial value. In the metallized article according to the present invention, no change was observed for the vacuum sealing property or the strength, even after holding for 60 minutes.

As described above, the nickel layer according to the present invention is formed by applying a Ni source paste and then firing same, and the resultant metallized layer has an excellent heat resistance and a greater thickness while ensuring a required strength and without increasing costs.

The second feature of the nickel layer according to the present invention is that interdiffusion occurs between the lower and the upper layers during the co-firing of these two layers, with the result that up to 40 wt% of wolfram is dissolved in the nickel layer. In the examples described later, the dissolved wolfram amount is usually 20 to 40 wt%. On the other hand, in the conventional metallization using the Mo-Mn process and a plating treatment, the amount of metals dissolved in the Ni layer is 5 wt% or less and the metallized layer has a microstructure quite different from that obtained according to the present invention. The increased dissolved amount of wolfram in the nickel layer increases the nickel layer strength, with the resulting great advantage that the metallized article is not damaged during handling.

As described above, the metallized article according to the present invention features not only characteristics but also a microstructure easily distinguished by an EPMA or an SEM observation.

Although the above description is focused on an alumina ceramic, other ceramics were also studied and it was proved that the same strength and sealing property is obtained for mullite ($2Al_2O_3$), steatite ($MgO$-$SiO_2$), forsterite ($2MgO$-$SiO_2$), and cordierite ($2MgO$-$2Al_2O_3$-$5SiO_2$). This shows that the metallizing method according to the present invention is particularly useful for a ceramic which contains a component highly reactive with a glassy component of the paste used for forming the lower metallized layer, i.e., a ceramic which contains an oxide component. Among the above ceramics, steatite and forsterite are less heat-resistive than $Al_2O_3$ and it was difficult to form a sound metallized layer by the conventional metallizing method in which a firing temperature of around 1450° C. is used. The present inventive metallizing method uses a lower firing temperature of from 1200° to 1400° C. and can sufficiently metallize such less heat-resistive ceramics by using such a lower firing temperature.

The wolfram used for forming the lower layer and the nickel for the upper layer usually have a purity of about 99%.

EXAMPLES

Example 1

Figure 4:
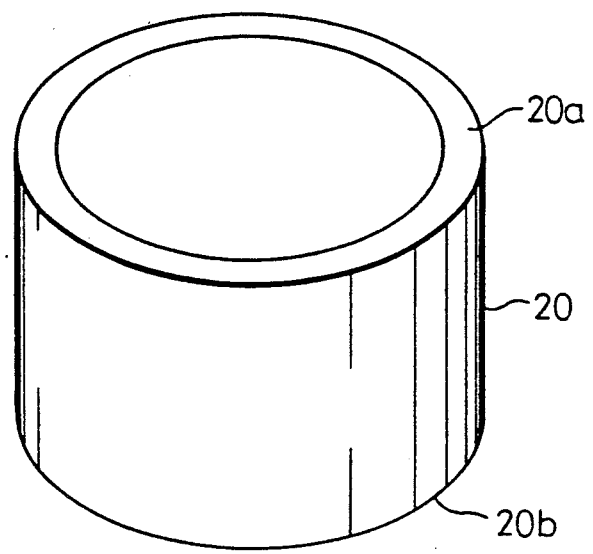
FIG. 4 shows a sintered alumina ceramic cylinder to be brazed to a metal member.
Figure 5:
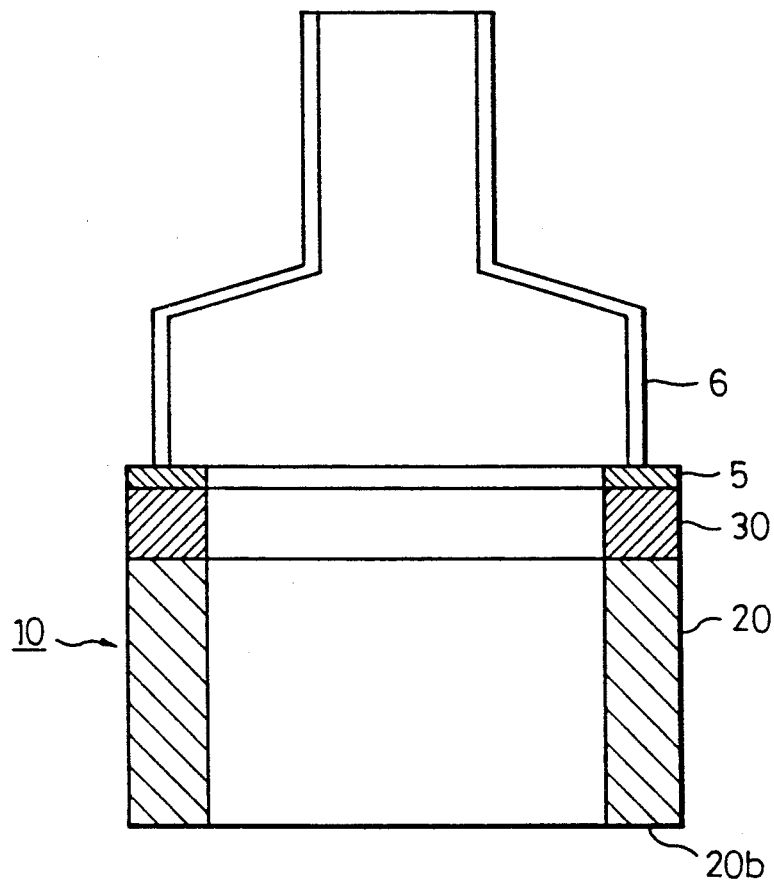
FIG. 5 is a sectional view of a bonded assembly of an alumina member of FIG. 4 and a copper member.

A sintered ceramic cylinder 20 12 mm in inner diameter, 16 mm in outer diameter, and 10 mm in height shown in FIG. 4 was brazed to a copper pipe shown in FIG. 5, using the present inventive metallizing method.

Figure 6:
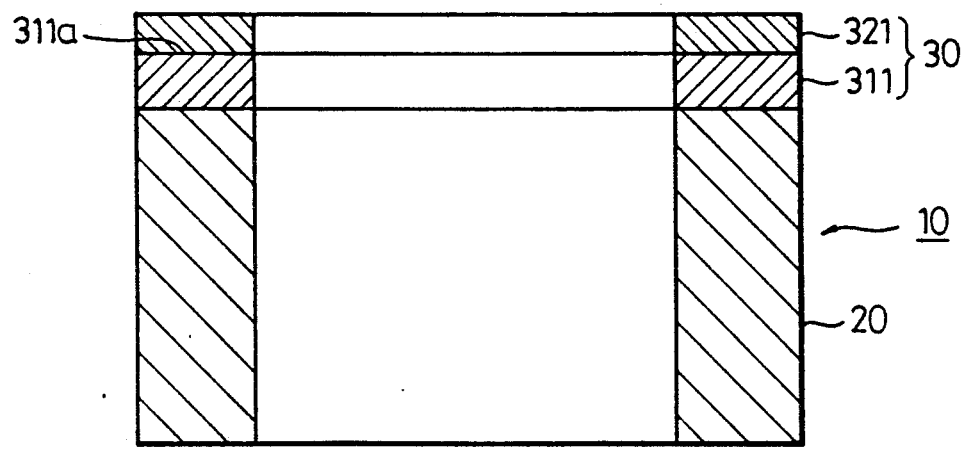
FIG. 6 is a sectional view of the metallized layer formed on the alumina member shown in FIG. 5.

The cylinder 20 is of an alumina ceramic containing 92% of $Al_2O_3$. An $Al_2O_3$-$MnO$-$SiO_2$ glass powder having a composition of $Al_2O_3:MnO:SiO_2=26:34:40$ was mixed with a wolfram powder at mixing ratios shown in Table 1, both powders having an adjusted particle diameter of not more than 5 μm, and the powder mixture was mixed with an organic vehicle to obtain a first paste. This paste was applied onto the upper end 20a of the cylinder 20 by screen printing, and the paste-applied cylinder was dried in an oven at 200° C. for 120 min to form a lower layer 311 as shown in FIG. 6. Then a nickel oxide powder having an adjusted particle diameter of not more than 5 μm was mixed with the same organic vehicle as mentioned above to form a second paste, which was then applied onto the surface 311a of the lower layer 311 by screen printing. The second paste-applied cylinder was dried in an oven at 200° C. for 120 min to form a upper layer 321, and thereafter, the cylinder was heated in a stream of a gas mixture of 90 vol% nitrogen and 10 vol% hydrogen having a dew point of 20° C. at a heating rate of 10° C./min to a temperature shown in Table 1, and held thereat for 60 min. Thereafter, the cylinder was cooled at a cooling rate of 10° C./min to obtain a metallized alumina body 10 having a metallized layer 30 formed thereon.

The metallized alumina body was brazed to a copper pipe 6 as shown in FIG. 5 to form a bonded assembly, which was then tested for the hermetic sealing property and the bonding strength thereof. The brazing was performed by disposing a brazing filler material 5 (JIS Z 3261 BAg-8) between the copper pipe 6 and the metallized layer 30 and then heating in a hydrogen atmosphere. A steel jig was attached to the base surface 20b of the alumina body 10 of the bonded assembly with a bonding adhesive having a required hermetic sealing property.

The hermetic sealing property was measured in terms of leakage from the top portion of the copper pipe 6 by using a helium leakage detector. The hermetic sealing property was evaluated "good" when the leakage was not more than $1 \times 10^{-10}$ Torr-l/sec. The bonding strength was determined by pulling the copper pipe upward while held in a fixed steel jig. Table 1 shows an example of the results in terms of two parameters, i.e., the mixing ratio of the glass and the wolfram powders and the firing temperature. The bonded assembly had a good property when the firing temperature was 1200° to 1400° C. and the mixing ratio of wolfram powder:glass powder was 70:30 to 95:5.

The bonded assembly shown in FIG. 5 was subjected to a heat cycle test in which it was heated from 50° C. to 600° C., held for 10 min, and cooled to 50° C., and this heat-hold-cool cycle was repeated. The heating rate was 34° C./min and the cooling rate was 37° C./min. The sample after the heat cycle test was tested to determine hermetic sealing property and the tensile strength thereof, and the results showed that, in the samples obtained by the conventional moly-manganese process, 10 heat cycles caused a loss of the hermetic sealing property and a lowered tensile strength of less than 100 kgf. In the samples metallized according to the present invention, the leakage after 10 heat cycles was less than $1 \times 10^{-10}$ and the tensile strength was higher than 350 kgf (copper pipe 6 was broken).

TABLE 1

| Firing Temp. °C. | Wolfram:Glass (weight ratio) | | | | | | | |
|---|---|---|---|---|---|---|---|---|
| | 65:35 | 70:30 | 75:25 | 80:20 | 85:15 | 90:10 | 95:5 | 100:0 |
| 1150 | x | x | x | x | x | x | x | x |
| 1200 | B | A | A | A | A | A | A | x |
| 1300 | B | A | A | AA | AA | AA | A | x |
| 1350 | B | A | A | AA | AA | AA | A | x |
| 1400 | x | A | A | A | A | B | B | x |
| 1450 | x | x | x | x | x | x | x | x |

AA: Leakage ≦ 1 × $10^{-10}$ Torr · l/sec; Tensile Strength > 350 kgf.
A: Leakage ≦ 1 × $10^{-10}$ Torr · l/sec; Tensile Strength = 150 − 350 kgf.
B: Leakage ≦ 1 × $10^{-10}$ Torr · l/sec; Tensile Strength < 150 kgf.
x: Leakage > 1 × $10^{-10}$ Torr · l/sec.

Example 2

The influence of the glass melting point was studied.

The mixing ratio of the wolfram and the glass powders was fixed at 80:20, but the melting point of the glass powder was adjusted to various values. The metallized layer 30 was formed in the same manner as in Example 1 and the hermetic sealing property and the bonding strength were measured.

Table 2 shows an example from the results thereof, and it was proved that it is necessary to control the firing temperature within 1200° to 1400° C. and the glass melting point within 1100° to 1300° C. to obtain good results.

TABLE 2

| Melting Point | Glass Composition | Firing Temperature (°C.) | | | | |
|---|---|---|---|---|---|---|
| | | 1450 | 1400 | 1300 | 1200 | 1150 |
| 1400° C. | CaO:MgO:SiO$_2$ = 42:10:48 | x | B | x | x | x |
| 1300 | Al$_2$O$_3$:MnO:SiO$_2$ = 26:34:40 | x | A | B | x | x |
| 1200 | Al$_2$O$_3$:MnO:SiO$_2$ = 10:45:45 | x | A | AA | A | x |
| 1100 | Al$_2$O$_3$:Na$_2$O:SiO$_2$ = 23:17:60 | x | B | A | A | x |
| 1050 | Al$_2$O$_3$:Na$_2$O:SiO$_2$ = 19:31:50 | x | x | x | x | x |

AA: Leakage ≦ 1 × 10$^{-10}$ Torr · l/sec; Tensile Strength > 350 kgf.
A: Leakage ≦ 1 × 10$^{-10}$ Torr · l/sec; Tensile Strength = 150 − 350 kgf.
B: Leakage ≦ 1 × 10$^{-10}$ Torr · l/sec; Tensile Strength < 150 kgf.
x: Leakage > 1 × 10$^{-10}$ Torr · l/sec.

Example 3

The influence of the particle diameter of wolfram, glass, and nickel source powders was studied in terms of the hermetic sealing property and the tensile strength, in the same manner as in Example 1.

The influence of the wolfram particle diameter was studied under a fixed particle diameter of 5 μm for the glass and nickel source; the influence of the glass particle diameter was studied under a fixed particle diameter of 5 μm for the wolfram and nickel source; and the influence of the nickel source particle diameter was studied under a fixed particle diameter of 5 μm for the wolfram and glass. Table 3 shows an example from the results thereof and it was proved that it is necessary to adjust the particle diameter for each of the wolfram, the glass, and the nickel source powders to obtain good results.

TABLE 3

| APD* | W | Glass | Ni |
|---|---|---|---|
| 20 μm | x | x | x |
| 10 | A | AA | A |
| 5 | AA | AA | AA |

APD*: Average Particle Diameter
AA: Leakage ≦ 1 × 10$^{-10}$ Torr · l/sec; Tensile Strength > 350 kgf.
A: Leakage ≦ 1 × 10$^{-10}$ Torr · l/sec; Tensile Strength = 150 − 350 kgf.
B: Leakage ≦ 1 × 10$^{-10}$ Torr · l/sec; Tensile Strength < 150 kgf.
x: Leakage > 1 × 10$^{-10}$ Torr · l/sec.

The present invention provides a method of metallizing an oxide ceramic which enables a 50% reduction of the equipment cost in comparison with that of the conventional moly-manganese process, while ensuring good metallization characteristics comparable with those of the conventional method. The present invention also eliminates the difficulty inevitably encountered in the conventional Mo-Mn process upon metallizing a ceramic having a relatively lower melting point.

We claim:

1. A method of metallizing an oxide ceramic to provide excellent hermetic sealing and brazing properties, comprising the steps of:

applying to a sintered oxide ceramic a first paste prepared by mixing with an organic vehicle a powder mixture composed of 70 to 95 wt% of a wolfram powder having an average particle diameter of 10 μm or less and 30 to 5 wt% of a glass powder having an average particle diameter of 10 μm or less and a melting point of from 1100° to 1300° C., drying the first paste-applied ceramic to form a primary coating on the ceramic, applying to the primary coating a second paste prepared by mixing with an organic vehicle one or more powders selected from the group consisting of nickel, nickel oxide, and nickel salt powders, having an average particle diameter of 10 μm or less, drying the second paste-applied ceramic to form a final coating on the primary coating, and firing the ceramic having the primary and the final coatings thereon at a temperature of from 1200° to 1400° C. which is not higher than the melting point of nickel and not lower than the melting point of the glass, in an atmosphere having a H$_2$/H$_2$O ratio higher than 1 and lower than 100000 in terms of partial pressure ratio, to form a two-layered metallized structure composed of an outermost layer of nickel and an underlying composite layer of wolfram and glass.

2. A method according to claim 1, wherein said sintered oxide ceramic is substantially composed of one oxide selected from the group consisting of alumina, mullite, steatite, forsterite, and cordierite.

3. A method according to claim 1, wherein said powder mixture is composed of 80 to 90 wt% of a wolfram powder and 20 to 10 wt% of a glass powder.

4. A method according to claim 1, wherein said firing is carried out at a temperature of from 1300° to 1350° C.

5. A method according to claim 1, wherein said atmosphere is composed of a mixture of hydrogen, water vapor, and one inert gas selected from the group consisting of nitrogen argon, and helium.

6. A method according to claim 1, wherein said atmosphere has a dew point of about 20° C. and a H$_2$:N$_2$ ratio of about 10:90 in terms of volume ratio.

* * * * *